US011290051B2

(12) United States Patent
Nakamura et al.

(10) Patent No.: US 11,290,051 B2
(45) Date of Patent: Mar. 29, 2022

(54) MOTOR CONTROL APPARATUS AND CONTROL METHOD OF THE SAME

(71) Applicant: CANON KABUSHIKI KAISHA, Tokyo (JP)

(72) Inventors: Shinji Nakamura, Kanagawa (JP); Koji Kawamura, Kanagawa (JP); Satoru Mikajiri, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/953,185

(22) Filed: Nov. 19, 2020

(65) Prior Publication Data

US 2021/0159842 A1 May 27, 2021

(30) Foreign Application Priority Data

Nov. 22, 2019 (JP) ............................ JP2019-211449

(51) Int. Cl.

| | |
|---|---|
| ***H02P 29/40*** | (2016.01) |
| ***H02P 6/15*** | (2016.01) |
| ***G01R 31/34*** | (2020.01) |
| ***H02P 7/28*** | (2016.01) |
| ***G01R 31/327*** | (2006.01) |

(52) U.S. Cl.

CPC .......... *H02P 29/40* (2016.02); *G01R 31/3277* (2013.01); *G01R 31/34* (2013.01); *H02P 6/15* (2016.02); *H02P 7/28* (2013.01)

(58) Field of Classification Search

CPC ............... H02P 29/40; H02P 6/15; H02P 7/28

USPC ................................ 318/799, 798, 767, 727

See application file for complete search history.

(56) References Cited

U.S. PATENT DOCUMENTS 10,389,288 B2 * 8/2019 Hashimoto ............... H02P 6/18

FOREIGN PATENT DOCUMENTS

| | | | |
|---|---|---|---|
| JP | 2008278595 | A | 11/2008 |
| JP | 2015119532 | A | 6/2015 |
| JP | 2015213398 | A | 11/2015 |
| JP | 2017077122 | A | 4/2017 |

* cited by examiner

*Primary Examiner* — David Luo

(74) *Attorney, Agent, or Firm* — Canon U.S.A., Inc. I.P. Division

(57) ABSTRACT

A motor control apparatus includes a motor, a motor driver to drive the motor, a motor current detection unit, a motor state estimation unit, a motor control unit, and first and second abnormality detection units. The motor current detection unit detects a current value of the motor. The motor state estimation unit estimates a state of the motor based on a voltage applied to the motor and the detected current value. The motor control unit applies a driving voltage of first driving corresponding to the estimated state of the motor or apply a driving voltage of second driving, which does not use the estimated motor state, to the motor driver. The first abnormality detection unit detects a rotation abnormality of the motor based on the estimated motor state. The second abnormality detection unit detects the rotation abnormality of the motor based on the detected current value of the motor.

12 Claims, 9 Drawing Sheets

IN ROTATION (NORMAL)

IN LOCK (ABNORMAL)
ch0 CURRENT WAVEFORM
THRESHOLD VALUE
0
(1) (2) (3) (4) (5) (6) (1) (2) (3) (4) (5) (6)

MOTOR CONTROL APPARATUS AND CONTROL METHOD OF THE SAME

BACKGROUND

Field

The present disclosure relates to a motor control apparatus and a control method of the motor control apparatus.

Description of the Related Art

In a laser beam printer, a brushless direct-current (DC) motor and the like are used to drive a photosensitive drum and a transfer belt. The brushless DC motor generally includes stators of three phases, namely a U phase, a V phase, and a W phase and is rotated by controlling a voltage applied to the stator of each phase. At that time, the brushless DC motor realizes a stable rotational speed by detecting a rotational speed, which varies according to a load and the like, and feeding back the detected rotational speed to control.

Conventionally, a sensor such as a Hall sensor and an encoder is generally used to detect a rotational speed of a motor. However, sensorless vector control (hereinbelow, referred to as sensorless field oriented control (SFOC)), which estimates a rotational speed from current values of three phases without using a sensor and the like, is widely used in recent years (refer to Japanese Patent Application Laid-Open No. 2015-213398).

In a case where rotation of a rotor becomes abnormal or stops due to occurrence of a motor failure or application of disturbance torque in the above-described SFOC method, it is necessary to protect an electric power converter and the motor by detecting the abnormality immediately and stopping the electric power converter that drives the motor.

Japanese Patent Application Laid-Open No. 2008-278595 discusses a method for detecting step-out using an angle of an extended induced voltage in the SFOC method using the extended induced voltage.

Japanese Patent Application Laid-Open No. 2017-77122 discusses a method for detecting step-out using a second speed and magnetic pole position estimation unit with a motor induced voltage, which is directly detected separately from a first speed and magnetic pole position estimation unit by an observer.

Japanese Patent Application Laid-Open No. 2015-119532 discusses a motor abnormality detection apparatus for detecting disconnection of a motor. The motor abnormality detection apparatus includes a locked state check part and a current value check part, and performs a method for shifting a phase of a current command value in a case where it is determined that the motor is in a locked state and a current value is in a disconnection undetectable range.

In a case where an abnormal state of the motor such as a lock state is detected in the sensorless vector control, whether the motor is locked is determined using an estimation result (for example, a speed estimation result) by a motor state estimation device as discussed in Japanese Patent Application Laid-Open No. 2017-77122. However, the motor state estimation device is based on a premise that the motor normally rotates. Therefore, if abnormality detection is performed based on an estimated speed, a current is indefinite, so that the state estimation does not work properly, and the estimated speed is also indefinite. Since the estimation result is indefinite and unreliable, erroneous detection may occur. Particularly, at the time of start-up, the estimated speed is indefinite and fluctuate in either an abnormal state or a normal state, and thus cannot be used.

SUMMARY

According to an aspect of the present disclosure, a motor control apparatus includes a motor, a motor driver configured to drive the motor, a motor current detection unit configured to detect a current value of the motor, a motor state estimation unit configured to estimate a state of the motor based on a voltage applied to the motor and the detected current value and, a motor control unit configured to apply a driving voltage of first driving corresponding to the estimated state of the motor or apply a driving voltage of second driving, which does not use the estimated state of the motor, to the motor driver, a first abnormality detection unit configured to detect a rotation abnormality of the motor based on the estimated state of the motor, and a second abnormality detection unit configured to detect the rotation abnormality of the motor based on the detected current value of the motor.

Further features of the present disclosure will become apparent from the following description of exemplary embodiments with reference to the attached drawings.

DESCRIPTION OF THE EMBODIMENTS

Figure 1:
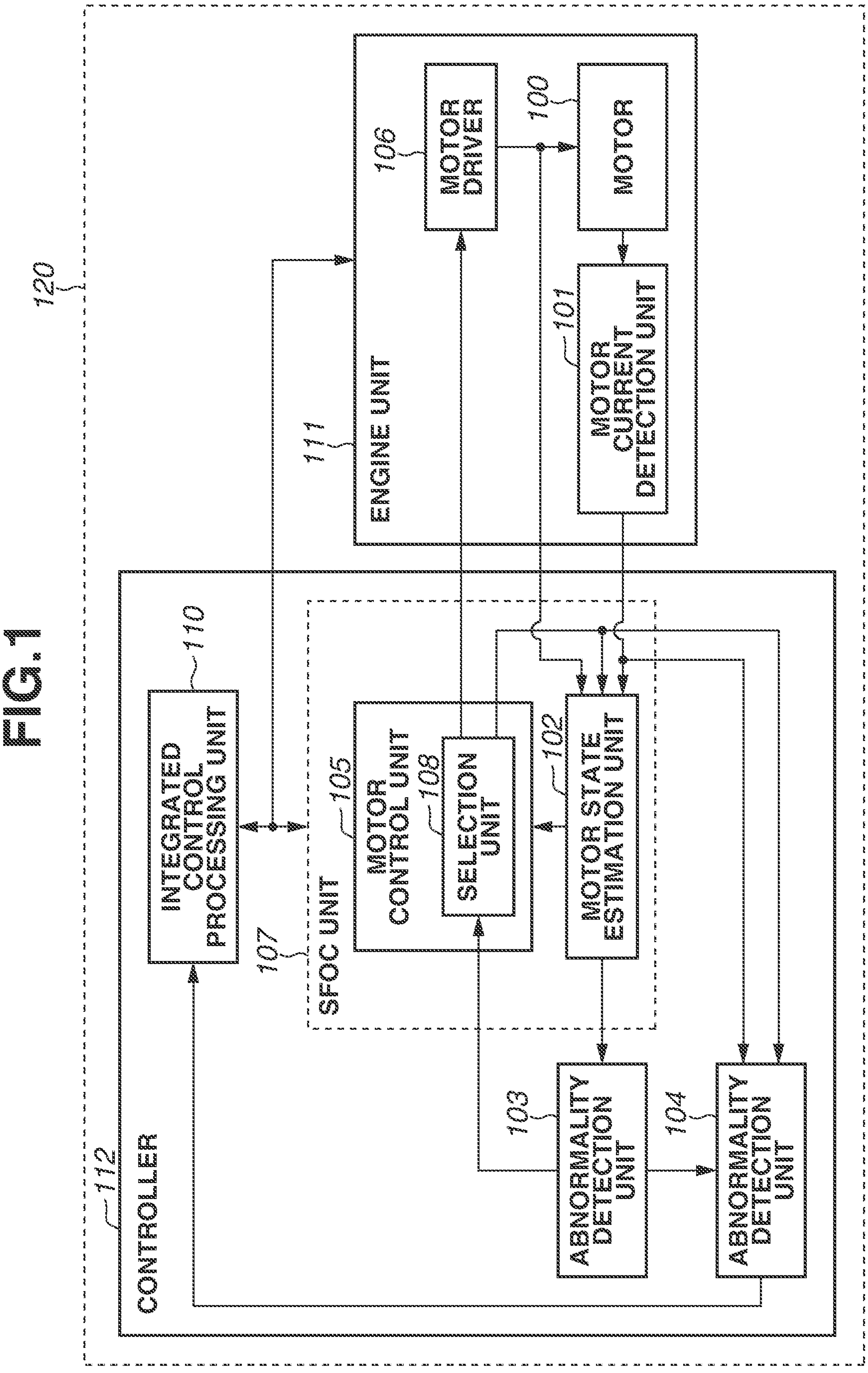
FIG. 1 illustrates a configuration example of a motor control apparatus.

FIG. 1 is a block diagram illustrating a configuration example of a motor control apparatus 120 according to an exemplary embodiment. The motor control apparatus 120 includes an engine unit 111 and a controller 112. The engine unit 111 is described. The engine unit 111 includes a motor 100, a motor driver 106, and a motor current detection unit 101. The motor 100 is a three-phase brushless motor. The motor driver 106 drives the motor 100 by applying a pulse voltage to each coil end of the motor 100 and causing a current to flow. The motor current detection unit 101 detects a coil current value flowing through each phase of the motor 100.

The controller 112 includes an integrated control processing unit 110, an abnormality detection unit 103, an abnormality detection unit 104, and a sensorless vector control unit (sensorless field oriented control (SFOC) unit) 107. The SFOC unit 107 includes a motor state estimation unit 102 and a motor control unit 105. The motor state estimation unit 102 estimates a state (an electrical angle and a speed) of the motor 100 from two input values, namely a current value detected by the motor current detection unit 101 and a voltage applied to each coil end of the motor 100. The motor control unit 105 includes a selection unit 108. In normal driving, the selection unit 108 selects a driving voltage of the normal driving corresponding to the state of the motor 100 estimated by the motor state estimation unit 102, and applies the selected driving voltage to the motor driver 106. In an abnormality detection mode, the selection unit 108 selects a driving voltage of pulse driving in which the state of the motor 100 estimated by the motor state estimation unit 102 is not used, and applies the selected driving voltage to the motor driver 106. The motor control unit 105 performs the normal driving in the normal driving and performs the pulse driving in the abnormality detection mode. The driving voltage of the normal driving has a sinusoidal waveform in which a pulse width is modulated in a predetermined period. The driving voltage of the pulse driving is a rectangular wave having a predetermined period and a predetermined duty ratio. When the driving voltage of the pulse driving is applied, the motor driver 106 rotates the motor 100 in a stepwise manner at a predetermined speed and a predetermined moving amount. In a case where the pulse driving is performed, the motor control unit 105 notifies the abnormality detection unit 104 of state information indicating whether each switching element of the motor driver 106 is in an ON state or an OFF state.

The integrated control processing unit 110 integrally controls the engine unit 111 and the SFOC unit 107. The abnormality detection unit 103 detects a rotation abnormality of the motor 100 based on the state (the electrical angle and the speed) of the motor estimated by the motor state estimation unit 102, and instructs the motor control unit 105 to perform the pulse driving in a case where it is determined that the rotation abnormality of the motor 100 has occurred. For example, in a case where the motor speed estimated by the motor state estimation unit 102 deviates by a predetermined value or more from a command speed, the abnormality detection unit 103 determines that the rotation abnormality of the motor 100 has occurred. The abnormality detection unit 104 detects the rotation abnormality of the motor 100 based on information about each switching element from the motor control unit 105 and the coil current value, flowing through each phase of the motor 100 in the pulse driving, detected by the motor current detection unit 101.

Figure 2:
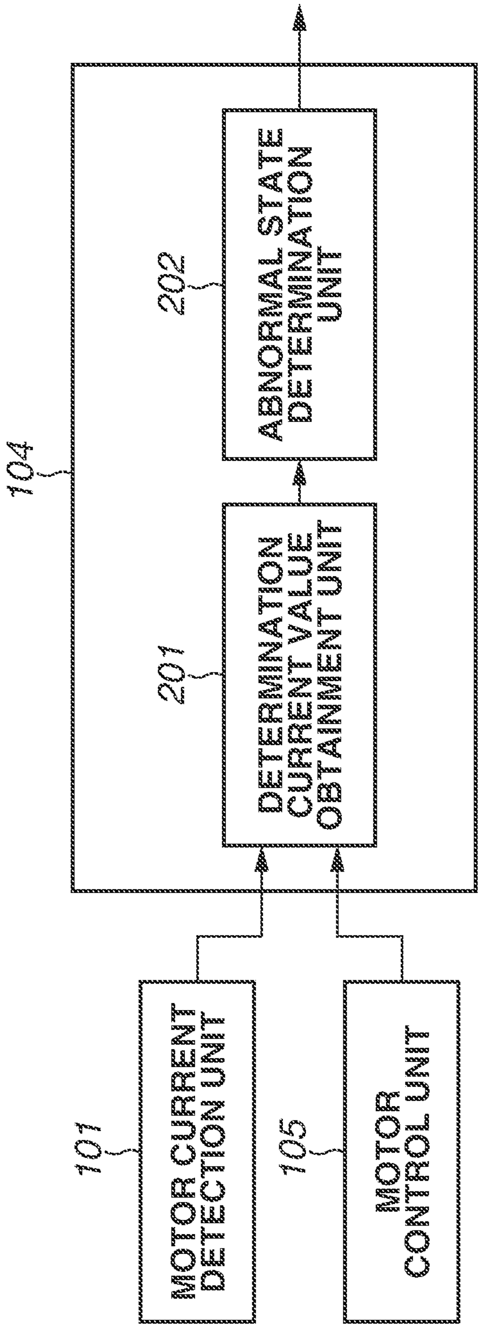
FIG. 2 illustrates a configuration example of an abnormality detection unit.

FIG. 2 is a block diagram illustrating a configuration example of the abnormality detection unit 104. The abnormality detection unit 104 includes a determination current value obtainment unit 201 and an abnormal state determination unit 202. The determination current value obtainment unit 201 determines whether it is a timing at which a current corresponding to an induced voltage can be obtained based on state information of each switching element from the motor control unit 105 in the pulse driving. The determination current value obtainment unit 201 obtains the coil current value, flowing through each phase of the motor 100, detected by the motor current detection unit 101 as a determination current value at a timing where the current corresponding to the induced voltage can be obtained. The abnormal state determination unit 202 determines that the motor 100 is in a lock state (rotation abnormality) in a case where the determination current value obtained by the determination current value obtainment unit 201 is greater than a predetermined threshold value. The abnormal state determination unit 202 can change a criterion (a threshold value) for determining the lock state according to a situation in which the rotation abnormality is detected (for example, at the time of start-up and the normal driving).

Figure 3:
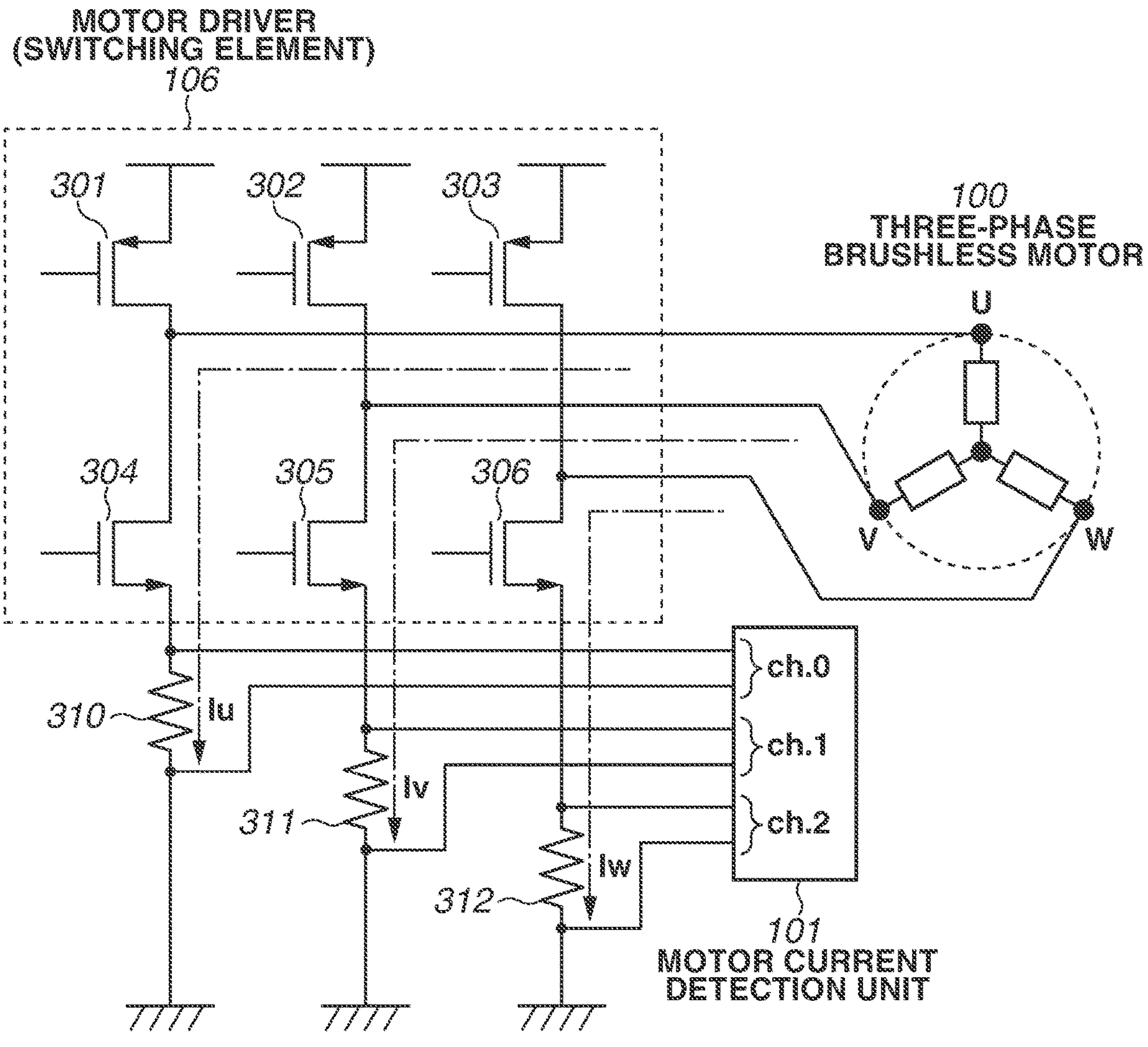
FIG. 3 illustrates a configuration example of a motor driver.

FIG. 3 illustrates the motor 100, field effect transistors (FETs) (switching elements) 301 to 306 in the motor driver 106, the motor current detection unit 101, and shunt resistors 310 to 312 for current measurement. The shunt resistor 310 for measuring a U phase current is connected to a series-connected circuit between a U phase high side FET 301 and a U phase low side FET 304, and to a ground potential node. The shunt resistor 311 for measuring a V phase current is connected to a series-connected circuit between a V phase high side FET 302 and a V phase low side FET 305, and to the ground potential node. The shunt resistor 312 for measuring a W phase current is connected to a series-connected circuit between a W phase high side FET 303 and a W phase low side FET 306, and to the ground potential node.

The motor driver 106 includes the U phase high side FET 301, the U phase low side FET 304, the V phase high side FET 302, the V phase low side FET 305, the W phase high side FET 303, and the W phase low side FET 306. The FETs 301 to 306 are switching elements and connected to the motor 100 as illustrated in FIG. 3. The high side FETs 301 to 303 are turned on in a case where a pulse width modulation (PWM) signal for driving the motor driver 106 is at a high level. The low side FETs 304 to 306 are turned on in a case where the PWM signal for driving the motor driver 106 is at a low level. The motor driver 106 normally generates and controls a voltage waveform for driving the FET to operate the FETs as described above.

For example, in a case where a current Iu flows through the shunt resistor 310, the low side FET 304 is an on state, and the high side FET 302 or 303 is in the on state. The high side FET 301 and the low side FET 304 can be turned off at the same time, but not turned on at the same time. The high side FET 302 and the low side FET 305 can be turned off at the same time, but not turned on at the same time. Further, the high side FET 303 and the low side FET 306 can be turned off at the same time, but not turned on at the same time.

The motor current detection unit 101 includes an analog-to-digital (A/D) converter. The motor current detection unit 101 can be an external integrated circuit (IC), or an internet protocol (IP) and a macro incorporated in a microcomputer, an application specific integrated circuit (ASIC), and the like. The motor current detection unit 101 detects a voltage applied to both ends of the shunt resistor 310 by a channel 0 (ch0), a voltage applied to both ends of the shunt resistor 311 by a channel 1 (ch1), and a voltage applied to both ends of the shunt resistor 312 by a channel 2 (ch2). The motor current detection unit 101 detects a voltage value in time division while switching the channels in order and detects a value obtained by dividing the detected voltage value by a shunt resistance value as a current value. The motor current detection unit 101 detects the current Iu flowing through the shunt resistor 310, a current Iv flowing through the shunt resistor 311, and a current Iw flowing through the shunt resistor 312.

Figure 4:
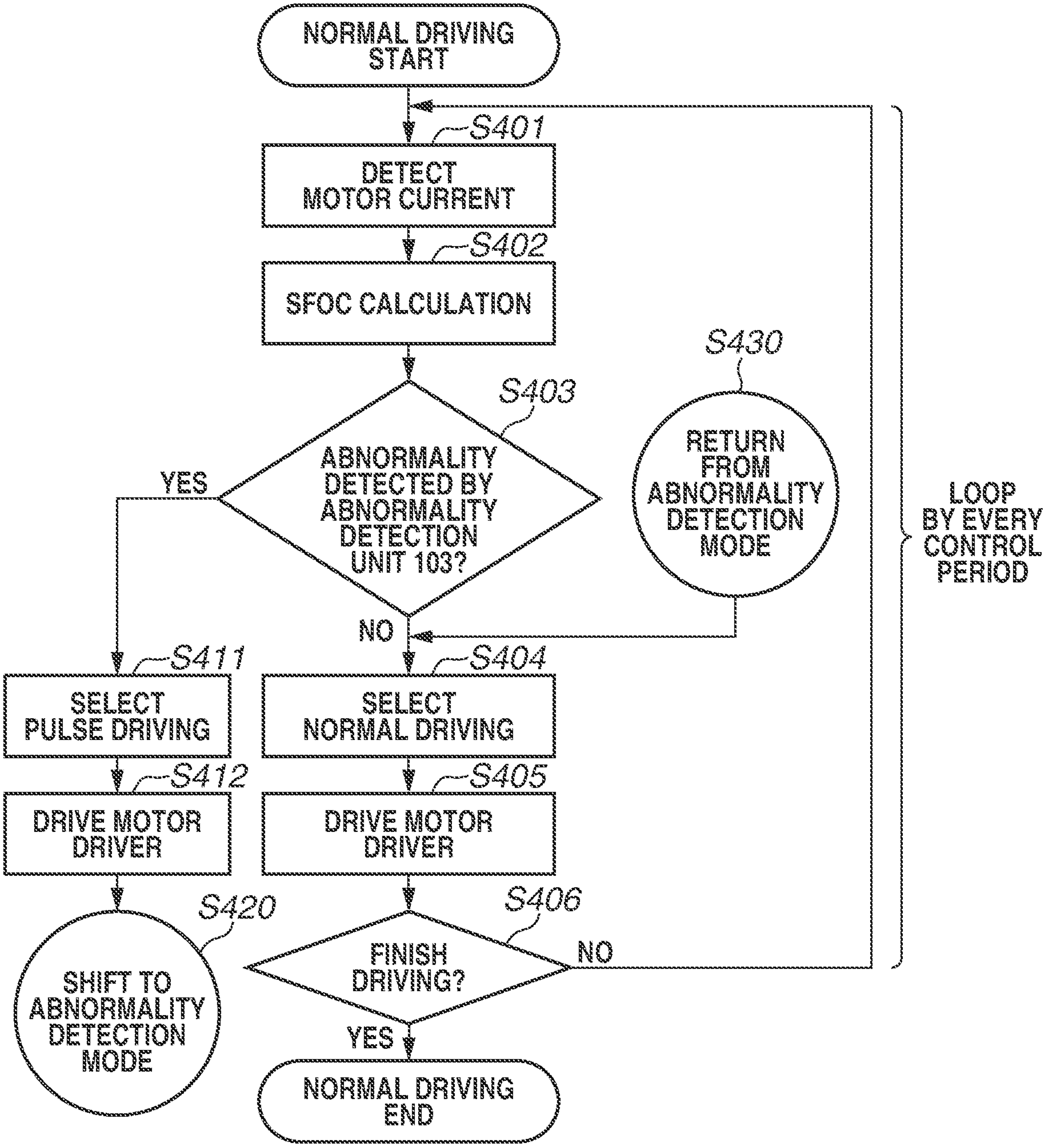
FIG. 4 is a flowchart illustrating processing in normal driving.

FIG. 4 is a flowchart illustrating a method for controlling the motor control apparatus 120. The motor control apparatus 120 starts processing in FIG. 4 based on start of the normal driving. In step S401, the motor current detection unit 101 detects values of the currents Iu, Iv, and Iw flowing through the motor 100. The motor current detection unit 101 outputs the detected values of the currents Iu, Iv, and Iw to the motor state estimation unit 102.

In step S402, the motor state estimation unit 102 estimates the state (the speed and the electrical angle) of the motor

100. The motor state estimation unit 102 estimates the state (the speed and the electrical angle) of the motor 100 by performing SFOC calculation based on the current value from the motor current detection unit 101 and the driving voltage from the motor driver 106. The motor state estimation unit 102 outputs an estimation result to the motor control unit 105 and the abnormality detection unit 103.

In step S403, the abnormality detection unit 103 detects the rotation abnormality of the motor 100 based on the speed of the motor 100. In a case where the speed estimated in step S402 greatly deviates from a target speed, and it is determined that the abnormality detection unit 103 detects the rotation abnormality of the motor 100 (suspected of being the rotation abnormality) (YES in step S403), the abnormality detection unit 103 notifies the abnormality detection unit 104 of such determination result and the processing proceeds to step S411. In a case where the speed estimated in step S402 deviates a little from the target speed, and it is determined that the abnormality detection unit 103 detects no rotation abnormality of the motor 100 (NO in step S403), the abnormality detection unit 103 notifies the motor control unit 105 of such determination result and the processing proceeds to step S404.

In step S404, the selection unit 108 selects the normal driving and applies the driving voltage of the normal driving to the motor driver 106. In a case where the determination result that the rotation abnormality of the motor 100 has not occurred is input from the abnormality detection unit 103, the motor control unit 105 continues to output a sinusoidal waveform to the motor driver 106 using predetermined PWM control.

In step S405, the motor driver 106 is driven by the normal driving. The motor driver 106 is input the sinusoidal waveform from the motor control unit 105 and applies a predetermined driving voltage to the motor 100.

In step S406, the motor control unit 105 determines whether to finish driving of the motor 100. In a case of finishing (YES in step S406), the motor control unit 105 ends the processing as it is, while in a case of continuing (NO in step S406), the processing returns to step S401. The motor control unit 105 determines whether to continuously drive or stop the motor 100 from the estimation result of the electrical angle of the motor 100 input from the motor state estimation unit 102. For example, the motor control unit 105 continuously drives the motor 100 in a case where the electrical angle has not reached a specified angle and stops driving of the motor 100 in a case where the electrical angle reaches the specified angle.

In step S411, since the rotation abnormality of the motor 100 is suspected, the selection unit 108 selects the pulse driving and applies the driving voltage of the pulse driving to the motor driver 106. In a case where the determination result that the rotation abnormality of the motor 100 has occurred is input from the abnormality detection unit 103, the motor control unit 105 outputs a rectangular wave to the motor driver 106 at predetermined pulse driving.

In step S412, the motor driver 106 is driven by the pulse driving. The motor driver 106 is input the rectangular wave from the motor control unit 105 and applies the predetermined driving voltage to the motor 100. Subsequently, the processing proceeds to processing in the abnormality detection mode in step S420 in FIG. 5.

Figure 5:
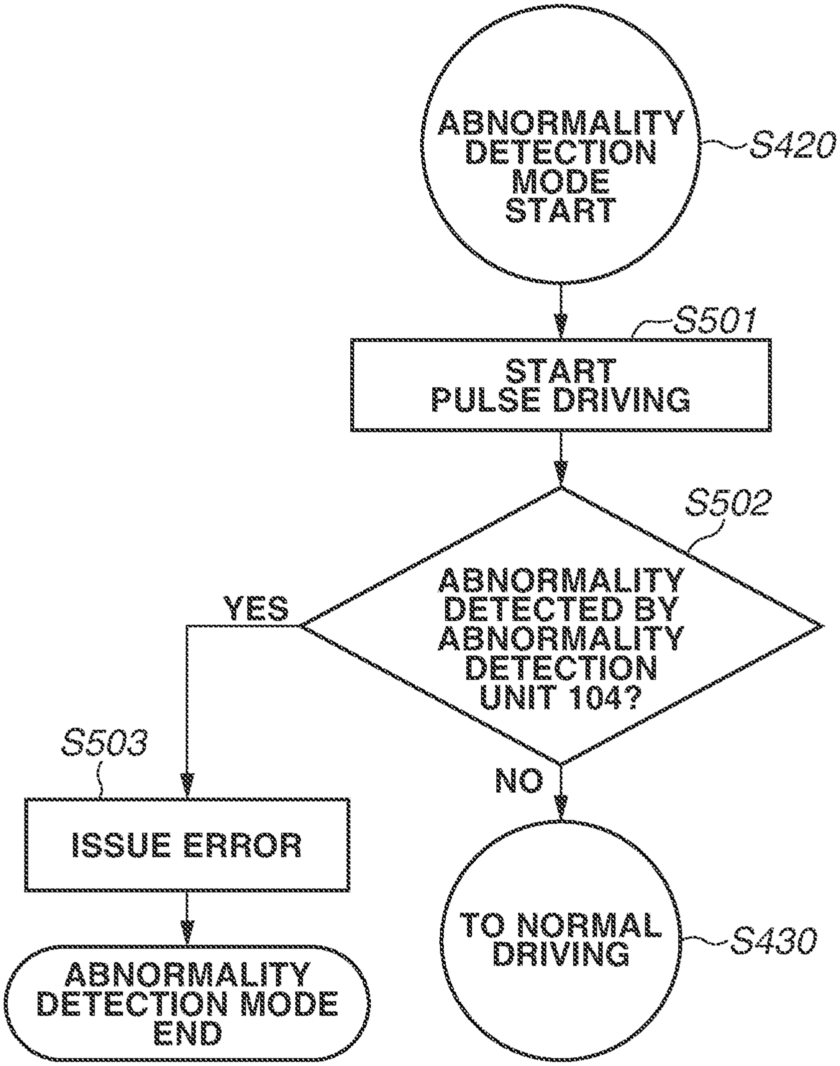
FIG. 5 is a flowchart illustrating processing in an abnormality detection mode.

FIG. 5 is a flowchart illustrating the processing in the abnormality detection mode in step S420. In step S501, the motor 100 is applied with the predetermined driving voltage and starts the pulse driving.

In step S502, the abnormality detection unit 104 detects the rotation abnormality of the motor 100 based on the detected current value of the motor 100. Specifically, the motor current detection unit 101 detects the current values flowing through the shunt resistors 310 to 312 in the pulse driving as described with reference to FIG. 2. The abnormality detection unit 104 determines the rotation abnormality of the motor 100 based on the current value detected by the motor current detection unit 101. In a case where it is determined that the abnormality detection unit 104 detects the rotation abnormality of the motor 100 (YES in step S502), the processing proceeds to step S503. In a case where it is determined that the abnormality detection unit 104 detects no rotation abnormality of the motor 100 (NO in step S502), the processing returns to step S404 in FIG. 4 via step S430. The abnormality detection unit 104 notifies the integrated control processing unit 110 of such determination result.

In step S503, the integrated control processing unit 110 issues an error interruption and ends the processing in FIG. 5.

Figure 6:
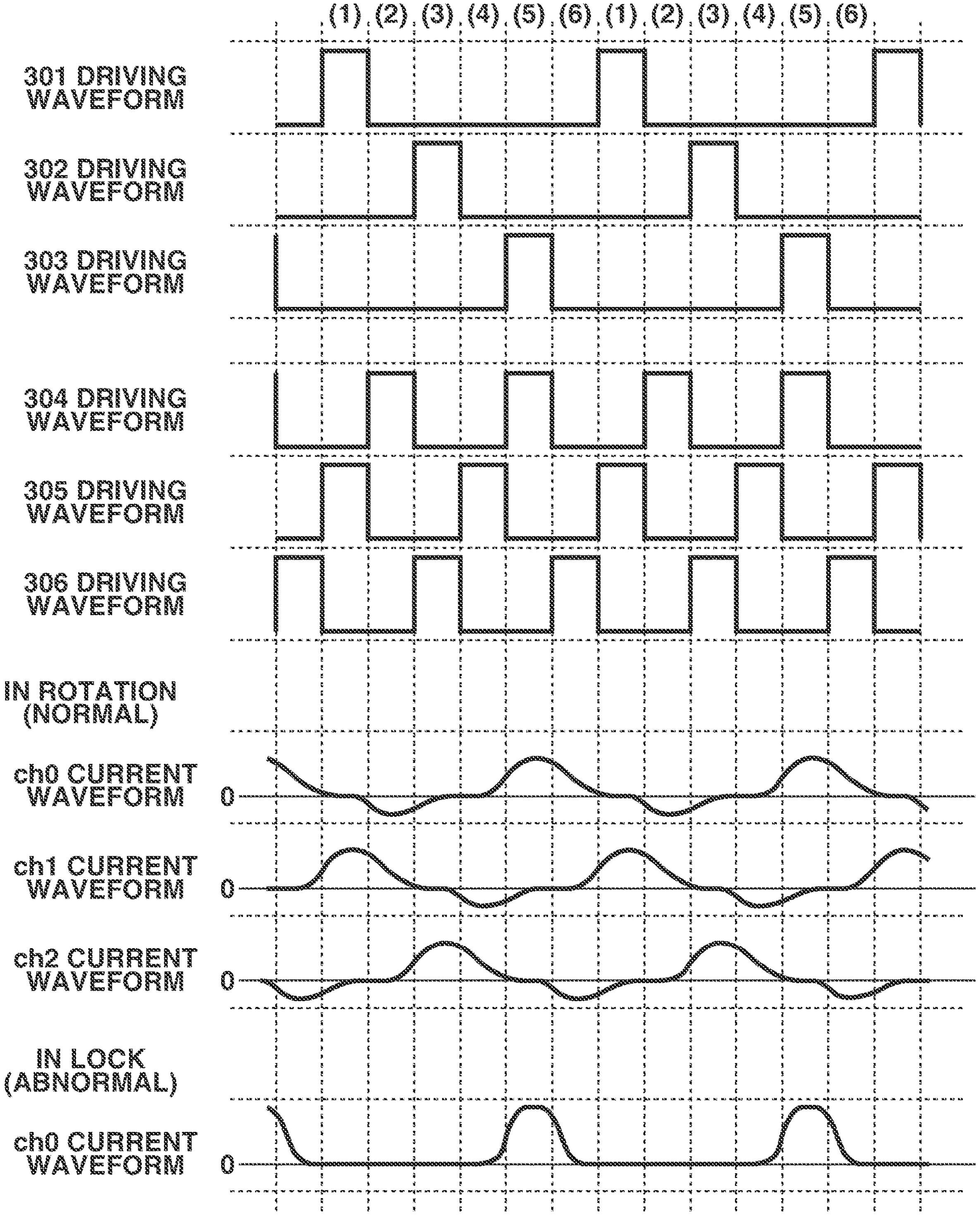
FIG. 6 illustrates driving waveforms and current waveforms.
Figures 7A, 7B:
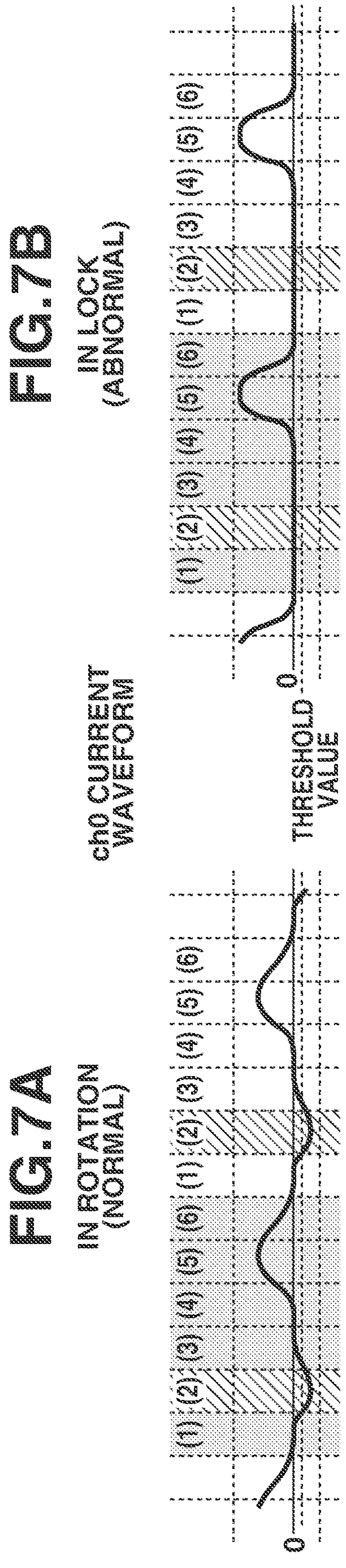
FIGS. 7A and 7B illustrate current waveforms when a motor is in rotation and in lock, respectively.

FIGS. 6, 7A, and 7B illustrate voltage waveforms for driving the FETs 301 to 306 in the pulse driving and current waveforms flowing through the shunt resistors 310 to 312. FIG. 6 illustrates how and what timing the current waveforms appear in the shunt resistors 310 to 312 in a case where the driving voltages of the FETs 301 to 306 are switched between the high level and the low level. The current waveforms appearing in the shunt resistors 310 to 312, when the motor 100 is in rotation (in normal rotation) and in lock (in the rotation abnormality), are both illustrated. FIGS. 7A and 7B illustrate a comparison of the current waveforms when the motor 100 is in rotation and in lock, in a case where the abnormality detection unit 104 determines the rotation abnormality of the motor 100.

In a case where an estimated motor speed deviates by the predetermined value or more from the command speed, and the rotation abnormality of the motor 100 is suspected from the estimated speed of the motor 100, the abnormality detection unit 103 changes a driving method from the normal driving to the pulse driving. In the pulse driving, the motor driver 106 operates the motor 100 as a stepping motor to rotate the motor 100 by transmitting, to each phase of the motor 100, a pulse signal for pulling in a predetermined angle. Therefore, if the motor 100 rotates normally, rotation of the motor 100 does not stop. The abnormality detection unit 104 determines the rotation abnormality of the motor 100 from the current waveforms appearing in the shunt resistors 310 to 312 in the pulse driving.

In a case where the motor 100 is rotated by the pulse driving in a normal state in which the motor 100 is not locked, an induced voltage according to the rotation state of the motor 100 is generated in a coil inside the motor 100, and a current corresponding to the induced voltage is generated. Therefore, for example, in a case where the U phase low side FET 304 is turned on at the high level of the driving waveform, a change of the current waveform can be obtained at timings (2) and (5) from the shunt resistor 310 as illustrated in the current waveform of the channel 0 in FIG. 6. At the timing (2) in the channel 0, all of the high side FETs 301 to 303 are turned off, and only the low side FET 304 is turned on, so that, if the motor 100 is rotated, only the current waveform corresponding to the induced voltage can be obtained. On the other hand, in a case of the rotation abnormality in which the motor 100 is locked and the induced voltage is not generated, the current corresponding to the induced voltage is not added to the current waveform.

Therefore, a waveform of the current flowing through the shunt resistor in the pulse driving becomes almost zero as illustrated in the current waveform at the timing (2) of the channel 0 in lock in FIG. 6. Accordingly, the abnormality detection unit 104 can determine the rotation abnormality of the motor 100 by setting a threshold value to near zero in consideration of noise and the like. In a case where the current value of the channel 0 is less than the threshold value at the timing (2), the abnormality detection unit 104 determines that the motor 100 is in the normal state, which is not the rotation abnormality of the motor 100. In a case where the current value of the channel 0 is more than the threshold value at the timing (2), the abnormality detection unit 104 determines that the rotation abnormality of the motor 100 has occurred. The abnormality detection unit 104 can detect the rotation abnormality of the motor 100 by determining a difference in the waveforms of the current flowing through the shunt resistor 310 at the timing (2) as illustrated in FIGS. 7A and 7B.

The determination current value obtainment unit 201 obtains a current value of the channel 0 detected by the motor current detection unit 101 at the timing (2) corresponding to the driving voltage of the pulse driving by the motor control unit 105. The abnormal state determination unit 202 determines that the rotation abnormality of the motor 100 has occurred in a case where the current value of the channel 0 obtained by the determination current value obtainment unit 201 is more than the threshold value, and determines that the rotation abnormality of the motor 100 has not occurred in a case where the current value of the channel 0 obtained by the determination current value obtainment unit 201 is less than the threshold value.

Similarly, the abnormality detection unit 104 can determine the rotation abnormality of the motor 100 by obtaining the determination current value at a timing (4) in the channel 1 and at a timing (6) in the channel 2.

According to the present exemplary embodiment, one or more circuits for current detection and detected current waveforms are indicated for three channels. However, the abnormality detection unit 104 can detect the rotation abnormality of the motor 100 if there is information for at least one channel. In addition, the driving waveforms of the FETs 301 to 306 in the pulse driving are illustrated in duty ratios in FIG. 6. However, the duty ratios can be changed as long as the motor 100 is not stopped.

Figure 8:
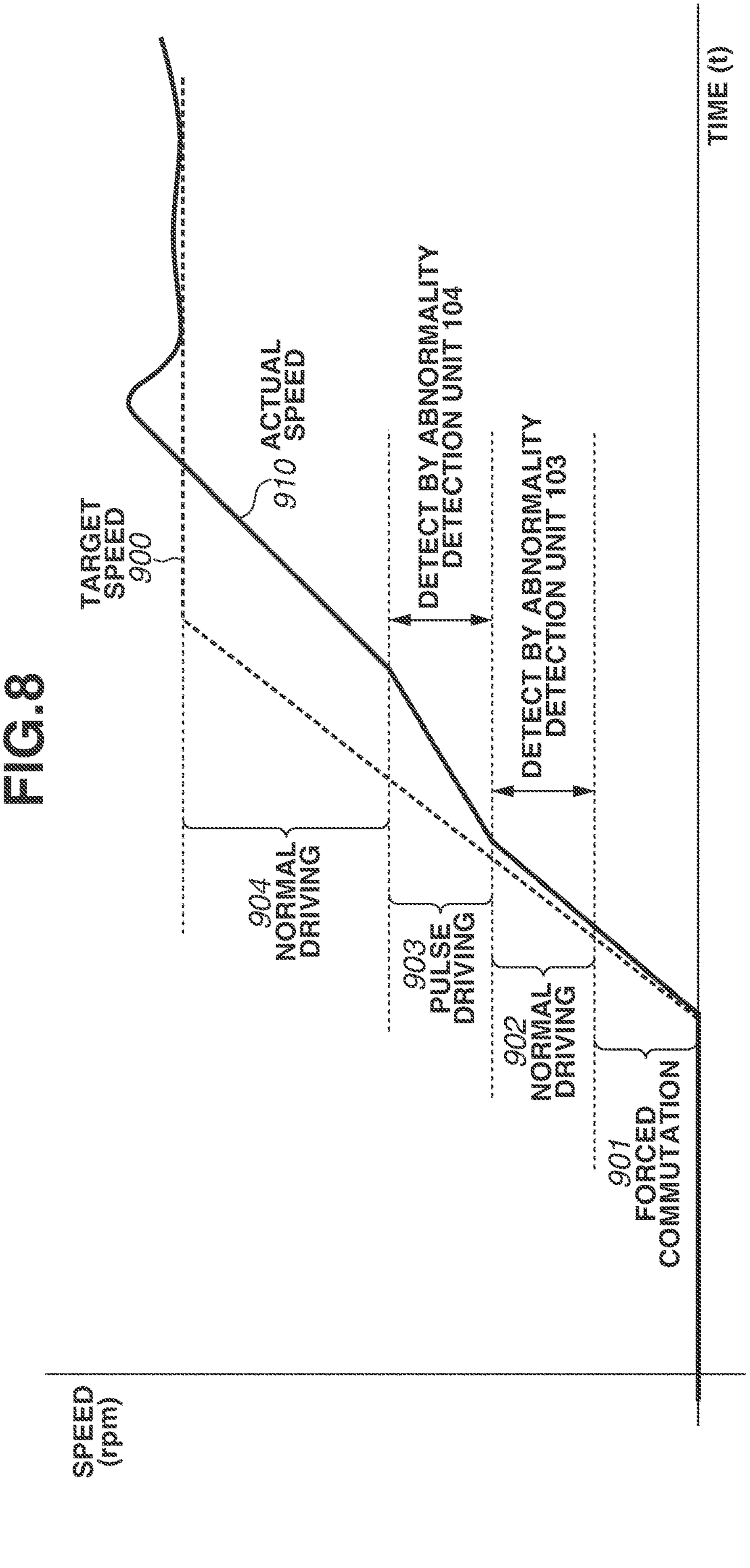
FIG. 8 illustrates abnormality detection at the time of start-up.

FIG. 8 illustrates an actual speed 910 of the motor 100 with respect to a target speed 900. An example is described below in which abnormality detection is performed at the time of start-up of the motor 100. First, the motor control unit 105 starts the motor 100 in a forced commutation mode 901, which is open control. Next, when the motor 100 reaches a predetermined speed, the motor control unit 105 switches from the forced commutation mode 901 to normal driving 902.

In a period of the normal driving 902, the motor control unit 105 applies the driving voltage of the normal driving to the motor driver 106, and the abnormality detection unit 103 detects the rotation abnormality of the motor 100 based on the estimated speed. In a case where the motor control unit 105 applies the driving voltage of the normal driving to the motor driver 106, the abnormality detection unit 103 detects the rotation abnormality of the motor 100. In a case where the abnormality detection unit 103 determines that the rotation abnormality of the motor 100 (the abnormality is suspected) has occurred, the motor control unit 105 switches the application of the driving voltage to the motor driver 106 from the normal driving 902 to pulse driving 903.

In a period of the pulse driving 903, the motor control unit 105 applies the driving voltage of the pulse driving to the motor driver 106, and the abnormality detection unit 104 detects the rotation abnormality of the motor 100 based on the detected current value. In a case where the motor control unit 105 applies the driving voltage of the pulse driving to the motor driver 106, the abnormality detection unit 104 detects the rotation abnormality of the motor 100. In a case where the abnormality detection unit 104 determines that the rotation abnormality of the motor 100 has not occurred, the motor control unit 105 switches the application of the driving voltage to the motor driver 106 from the pulse driving 903 to the normal driving 904. The motor 100 maintains the rotation state by the pulse driving 903 even in a case where the rotation abnormality of the motor 100 is not found and thus can restart the normal driving 904 without stopping. In addition, the motor control unit 105 returns to the normal driving 904 by setting the speed and angle to those set in the pulse driving 903 by taking over the speed detected immediately before so as not to generate a level difference in the motor speed.

Figure 9:
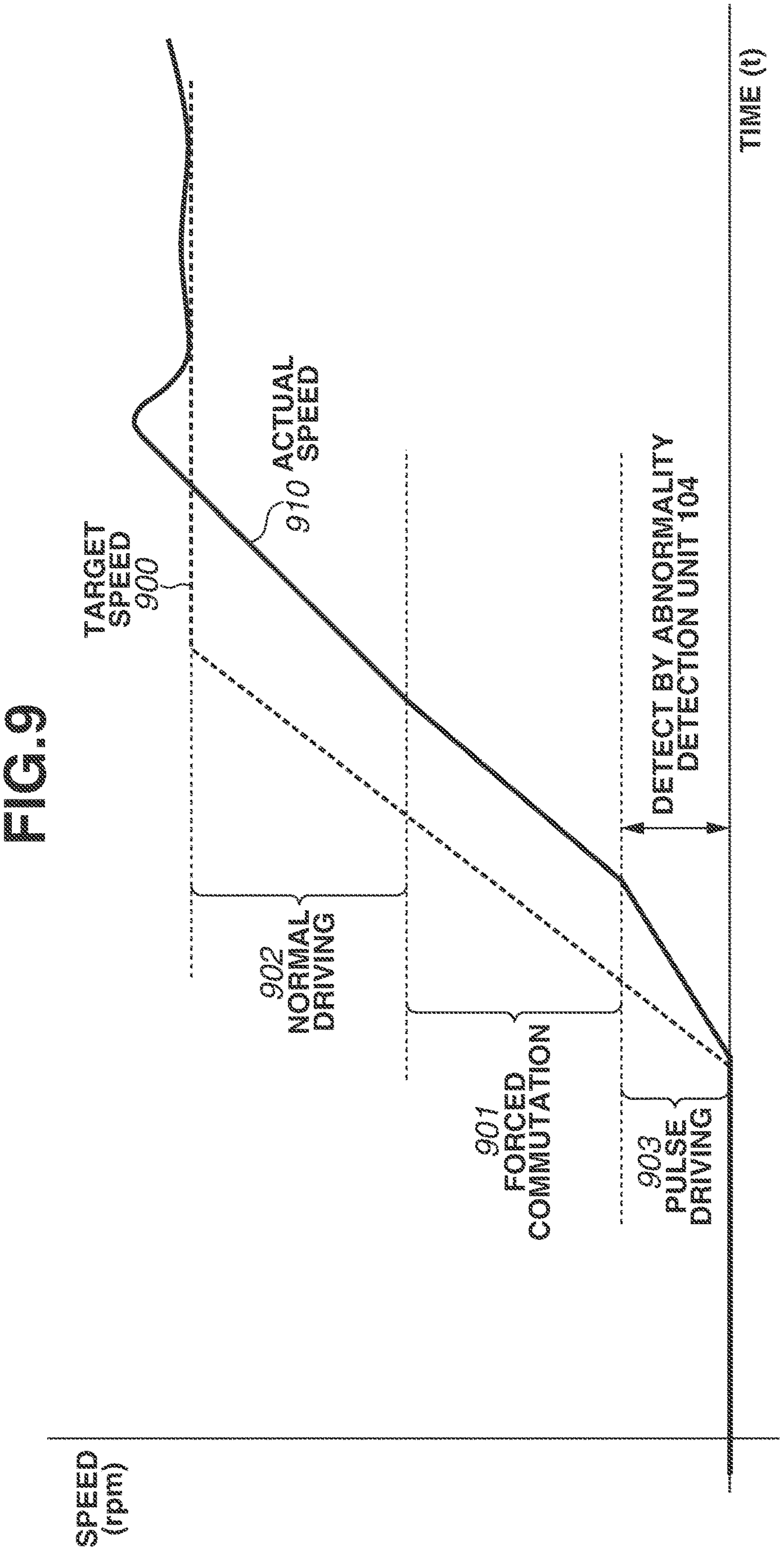
FIG. 9 illustrates abnormality detection before start-up.

FIG. 9 illustrates the actual speed 910 of the motor 100 with respect to the target speed 900. An example is described below in which abnormality detection is performed before start-up of the motor 100. Only the abnormality detection unit 104 performs abnormality detection.

Since an abnormality of the motor 100 is suspected before start-up, the motor control unit 105 applies the driving voltage of the pulse driving 903 to the motor driver 106 in a state in which the motor 100 is stopped to rotate the motor 100. In a period of the pulse driving 903, the abnormality detection unit 104 determines whether the rotation abnormality of the motor 100 has occurred based on the current value.

In a case where the abnormality detection unit 104 determines that the rotation abnormality of the motor 100 has not occurred, the motor control unit 105 starts the motor 100 in the forced commutation mode 901, which is the open control as with the normal start-up.

Subsequently, when the motor 100 reaches the predetermined speed, the motor control unit 105 applies the driving voltage of the normal driving 902 to the motor driver 106.

As described above, in a case where the rotation abnormality of the motor 100 is suspected at the time of or before start-up of the motor 100, the motor control unit 105 starts the motor 100 by the pulse driving 903. The abnormality detection unit 104 determines the rotation abnormality of the motor 100 based on the current waveform in the pulse driving 903.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may include one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The exemplary embodiments described above are merely examples for implementing the present disclosure, so that the examples should not be construed restrictively limiting the technical scope of the present disclosure. In other words, the present disclosure can be implemented in the various forms without departing from the technical idea and/or the main features thereof.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-211449, filed Nov. 22, 2019, which is hereby incorporated by reference herein in its entirety.

What is claimed is:

1. A motor control apparatus comprising:

a motor;

a motor driver configured to drive the motor;

a motor current detection unit configured to detect a current value of the motor;

a motor state estimation unit configured to estimate a state of the motor based on a voltage applied to the motor and the detected current value;

a motor control unit configured to apply a driving voltage of first driving corresponding to the estimated state of the motor or apply a driving voltage of second driving, which does not use the estimated state of the motor, to the motor driver;

a first abnormality detection unit configured to detect a rotation abnormality of the motor based on the estimated state of the motor; and a second abnormality detection unit configured to detect the rotation abnormality of the motor based on the detected current value of the motor.

2. The motor control apparatus according to claim 1, wherein, in a case where the motor control unit applies the driving voltage of the first driving to the motor driver, the first abnormality detection unit detects any rotation abnormality of the motor, and wherein, in a case where the motor control unit applies the driving voltage of the second driving to the motor driver, the second abnormality detection unit detects any rotation abnormality of the motor.

3. The motor control apparatus according to claim 1, wherein, in a case where the first abnormality detection unit determines that the rotation abnormality of the motor has occurred, the motor control unit switches from application of the driving voltage of the first driving to application of the driving voltage of the second driving with respect to the motor driver.

4. The motor control apparatus according to claim 1, wherein the state of the motor is an electrical angle or a speed of the motor.

5. The motor control apparatus according to claim 1, wherein the driving voltage of the first driving has a sinusoidal waveform in which a pulse width is modulated in a predetermined period, and wherein the driving voltage of the second driving is a rectangular wave having a predetermined period and a predetermined duty ratio.

6. The motor control apparatus according to claim 1, wherein, in a case where the driving voltage of the second driving is applied, the motor driver rotates the motor in a stepwise manner at a predetermined speed and a predetermined moving amount.

7. The motor control apparatus according to claim 1, wherein the second abnormality detection unit determines that the rotation abnormality of the motor has occurred in a case where a current value of the motor at a predetermined timing is more than a threshold value, and determines that the rotation abnormality of the motor has not occurred in a case where the current value of the motor at the predetermined timing is less than the threshold value.

8. The motor control apparatus according to claim 1, wherein the second abnormality detection unit includes a current value obtainment unit and a determination unit, wherein the current value obtainment unit is configured to obtain a current value detected by the motor current detection unit at a timing corresponding to the driving voltage of the second driving by the motor control unit, and wherein the determination unit is configured to determine that the rotation abnormality of the motor has occurred in a case where the current value obtained by the current value obtainment unit is more than a threshold value, and to determine that the rotation abnormality of the motor has not occurred in a case where the current value obtained by the current value obtainment unit is less than the threshold value.

9. The motor control apparatus according to claim 1, wherein, in a case where the second abnormality detection unit determines that the rotation abnormality of the motor has not occurred, the motor control unit switches from application of the driving voltage of the second driving to application of the driving voltage of the first driving with respect to the motor driver.

10. The motor control apparatus according to claim 1, wherein, in a case where the motor control unit applies the driving voltage of the second driving to the motor driver in a state in which the motor is stopped, and the second abnormality detection unit determines that the rotation abnormality of the motor has not occurred, the motor control unit applies the driving voltage of the first driving to the motor driver via a forced commutation mode.

11. A method for controlling a motor control apparatus having a motor and a motor driver configured to drive the motor, the method comprising:

detecting a current value of the motor;

estimating a state of the motor based on a voltage applied to the motor and the detected current value;

applying a driving voltage of first driving corresponding to the estimated state of the motor or applying a driving voltage of second driving, which does not use the estimated state of the motor, to the motor driver;

detecting a rotation abnormality of the motor based on the estimated state of the motor; and detecting the rotation abnormality of the motor based on the detected current value of the motor.

12. A non-transitory computer-readable storage medium storing a program to cause a computer to perform a method for controlling a motor control apparatus having a motor and a motor driver configured to drive the motor, the method comprising:

detecting a current value of the motor;

estimating a state of the motor based on a voltage applied to the motor and the detected current value;

applying a driving voltage of first driving corresponding to the estimated state of the motor or applying a driving voltage of second driving, which does not use the estimated state of the motor, to the motor driver;

detecting a rotation abnormality of the motor based on the estimated state of the motor; and detecting the rotation abnormality of the motor based on the detected current value of the motor.

* * * * *